United States Patent [19]

Yang et al.

[11] Patent Number: 5,627,904

[45] Date of Patent: May 6, 1997

[54] MINIATURE LOUDSPEAKER CLIP STRUCTURE

[76] Inventors: Su-Pei Yang, 2F, No. 110, Lane 103, Sec. 2, Nei Hu Rd.; Shyh-Lee Chen, No. 16, Alley 12, Lane 190, Chorng Yang Rd., Nan Gang District, both of Taipei, Taiwan

[21] Appl. No.: 624,742

[22] Filed: Mar. 27, 1996

[51] Int. Cl.$^6$ ................................................. H04R 25/00
[52] U.S. Cl. ........................... 381/205; 381/188; 381/87
[58] Field of Search ..................................... 381/188, 205, 381/88, 87, 90; 181/150, 171

[56] References Cited

U.S. PATENT DOCUMENTS 5,168,527  12/1992  Loya .................................... 381/188
5,239,589  8/1993  Yang et al. ........................... 381/188

*Primary Examiner*—Sinh Tran
*Attorney, Agent, or Firm*—Bacon & Thomas

[57] ABSTRACT

A clip structure for clamping a miniature loudspeaker onto a printed circuit board. This structure has a loudspeaker shell body, a copper ring, a vibrating membrane and a fix ring. A large step wall and a small step wall form a circumference wall on the loudspeaker shell body with three concave sections in the large step wall. A copper ring is located on an end surface of the small step wall. Horizontal portions of inverted L-type clips on the copper ring pass through the outer circular concave sections of the large step wall. The vibrating membrane is held on the copper ring by the fix ring. The clips of the copper ring can mounted the miniature speaker onto prearranged holes in the printed circuit board securely without the fear of loosening.

3 Claims, 5 Drawing Sheets

MINIATURE LOUDSPEAKER CLIP STRUCTURE

BACKGROUND OF THE INVENTION

The present invention pertains to a miniature loudspeaker clip structure used to clip a miniature loudspeaker securely onto a printed circuit board. By means of this structure, the miniature speaker can be securely mounted onto the printed circuit board. Furthermore, this mounting can be strengthened by means of welding without the fear of loosening.

DESCRIPTION OF THE PRIOR ART

The known way to mount a miniature loudspeaker is to weld prongs to the circumference of the miniature loudspeaker body in order to match holes prearranged on the printed circuit board. Then, those prongs are welded to connect the speaker securely onto the printed circuit board. However, this kind of mounting structure needs to weld prongs and thereby requires excessive time and labor. The holes are prearranged on the printed circuit board making it very difficult to match precisely with the prongs, thereby forming a loose connection so that it is difficult to weld. For example, U.S. Pat. No. 5,168,527 discloses two or three sets of prongs and the frame of the miniature speaker formed together as one unified structure. The prongs have at least one step to connect with the printed circuit board. In order to easily fit the variety of steps of the prongs into the holes on the printed circuit board, the holes slightly larger than the steps to avoid the difficulty of fitting. Therefore, a large clearance is formed between the step and the holes which cause loosening, although the prongs smoothly fit into the printed circuit board.

SUMMARY OF THE INVENTION

It is the primary object of the present invention to provide a miniature loudspeaker clip structure. This structure comprises a loudspeaker shell body, a copper ring, a vibrating membrane and a fix ring. A circumference wall of the loudspeaker comprises a large step wall and a small step wall. There are three concave sections in the large step wall. A copper ring is put on the surface of the small step wall. Horizontal portions of the inverted L-type clips pass through the concave sections of the loudspeaker shell body. The vertical portions of the inverted L-type clip extend downward along the circumference wall of the loudspeaker shell body. The vibrating membrane is placed on the copper ring and held in place by the fix ring on the small step wall. Therefore, the clips of the copper ring can mount the miniature loudspeaker onto prearranged holes of the printed circuit board securely without the fear of loosening so that the face of loudspeaker makes sound on the back of the printed board.

A second object of the present invention is to provide a miniature loudspeaker clip structure in which the clips extend upward along circumference of the loudspeaker shell body and onto the holes of the printed circuit board so that the face of the loudspeaker makes sound on the front of the printed circuit board.

DETAILED DESCRIPTION OF THE PREFERRED EMBODIMENTS

Figure 1:
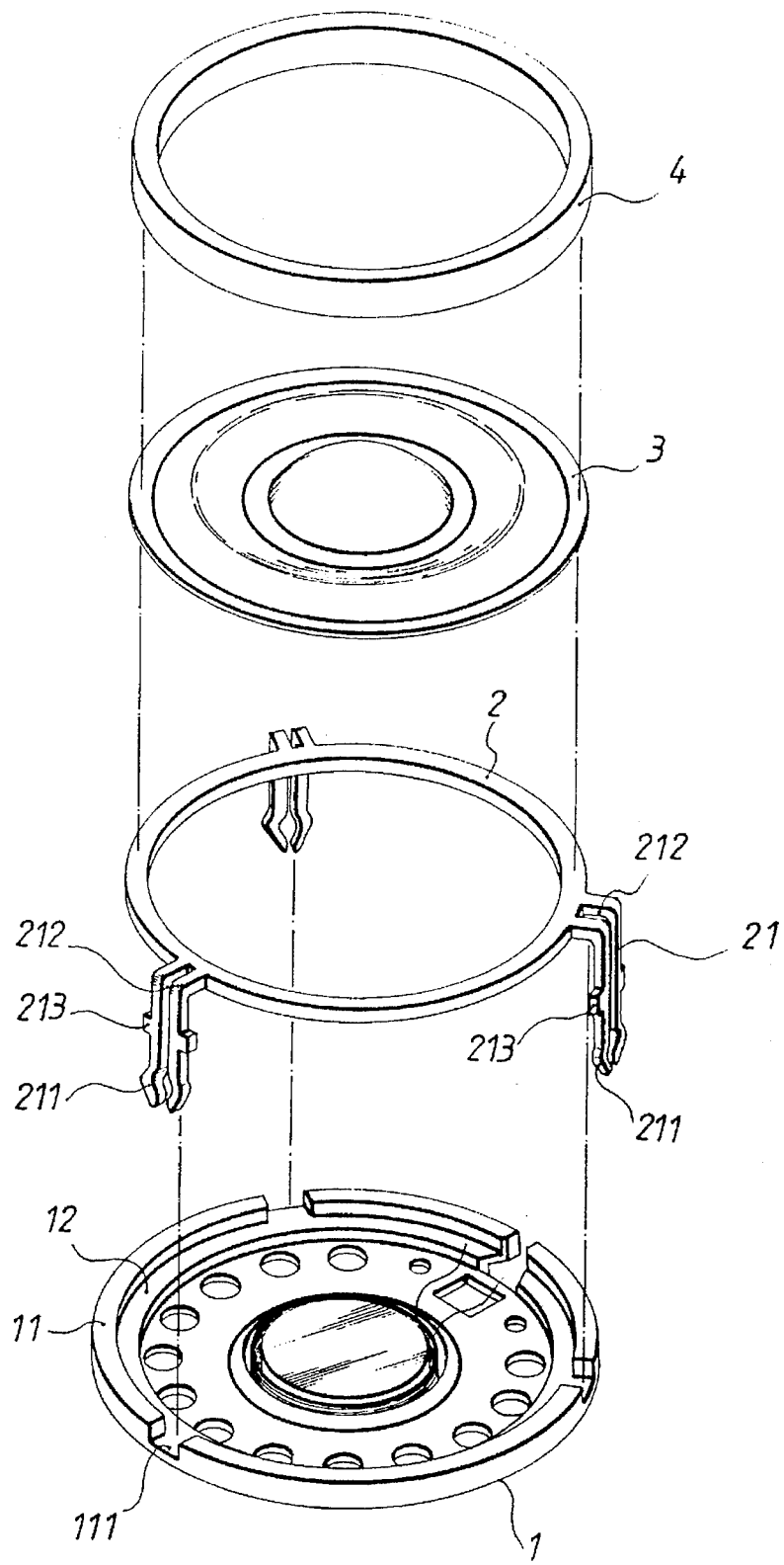
FIG. 1 is a exploded perspective view of the present invention.
Figure 5:
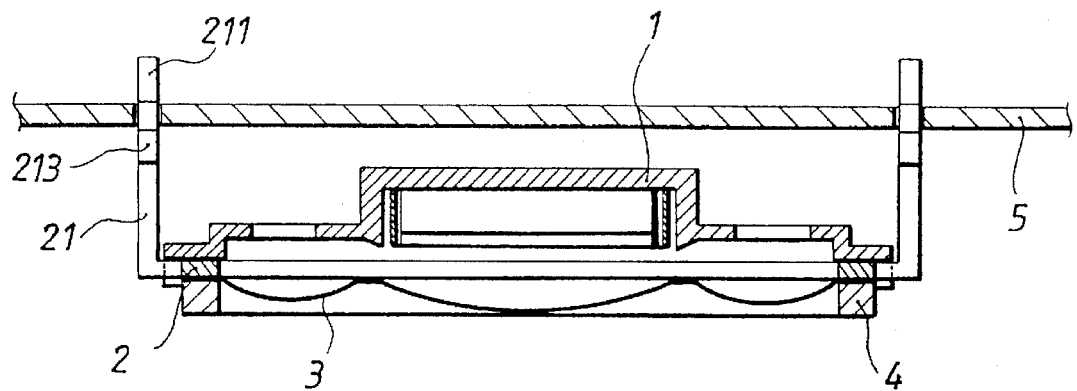
FIG. 5 is a cross-sectional view of the embodiment of FIG. 3.
Figure 6:
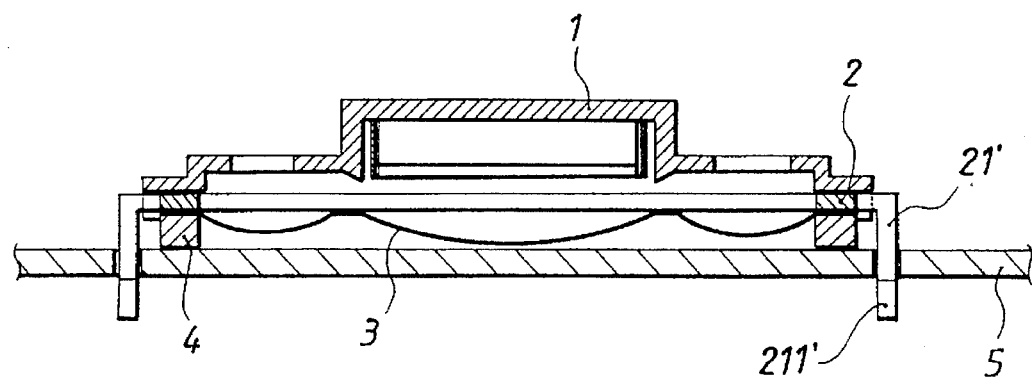
FIG. 6 is a cross-sectional view of the embodiment of FIG. 4.

As shown in FIG. 1, the present invention provides a miniature loudspeaker clip structure to clamp the miniature loudspeaker onto a printed circuit board 5 (see FIG. 5). There are two types of clamping, one of which is for the face of a loudspeaker making sound on the back of the printed circuit board 5, as shown in FIG. 5. The other type is for the face of a loudspeaker that makes sound on the front of the printed circuit board 5, as shown in FIG. 6. The present invention comprises a loudspeaker shell body 1, a copper ring 2, a vibrating membrane 3 and a fix ring 4. Whether the face of loudspeaker is on the front or back of the printed circuit board is decided by the direction of the clips 21 of the copper ring 2 and the face of the loudspeaker shell body. The face of the loudspeaker on the back of the printed circuit board 5 will be the example to be described as follows:

A loudspeaker shell body 1 is formed as a concave ring and constructed from one metal stamping. The circumference wall of the shell body is formed by stepped walls 11 and 12. Step wall 11 has three concave sections 111.

A circular copper ring 2 fits on the step wall 12 of the aforementioned loudspeaker shell body 1. Copper ring 2 has three L-type clips 21 configured such that a horizontal portion of each clip 21 passes through the corresponding concave section 111 of the loudspeaker shell body 1. The vertical portion of each clip 21 extends downward from with the circumference of the loudspeaker shell body 1. The tip of the vertical portion of each clip 21 has a cone-shaped clipper 211. The arrow-shaped clip 21 is divided vertically by a vertical groove 212. The clip 21 is an elastic clipper. There is a flange 213 extending from each of the two side walls of the clip 21.

A vibrating membrane 3 is located on the top of the cooper ring 3 held in place by circular fix ring 4.

Figure 3:
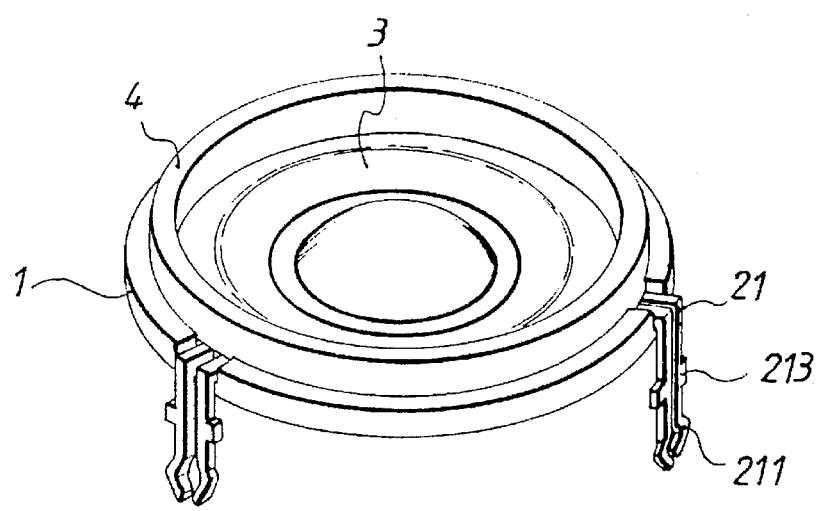
FIG. 3 is a perspective view of the embodiment of FIG. 1.

The aforementioned parts are assembled by putting the copper ring 2 and the vibrating membrane 3 into the loudspeaker shell body 1 and then fixing the a fix ring 4 in order to form a loudspeaker, as shown in FIG. 3. By means of the clip 21 of the copper ring 2, the loudspeaker is clamped onto the prearranged holes of the printed circuit board 5. The face of the loudspeaker makes sound on the back of the printed circuit board 5, as shown in FIG. 5. Because the clips 21 are elastic, the clips can clamp tightly with the top and bottom surfaces of the printed circuit board 5. Moreover, the cone-shaped clipper 211 and the flanges 213 on the two side walls clamp the wall of the holes on the printed circuit board 5. Therefore, the clamping will be very tight no matter what the sizes of the holes (within a certain range) through the printed circuit board 5. However, in order to clamp the loudspeaker shell body more securely, welding can be further used. Before the welding, the clips 21 of the present invention clamp securely so that it is very difficult to become loose due to transportation or vibration.

Figure 2:
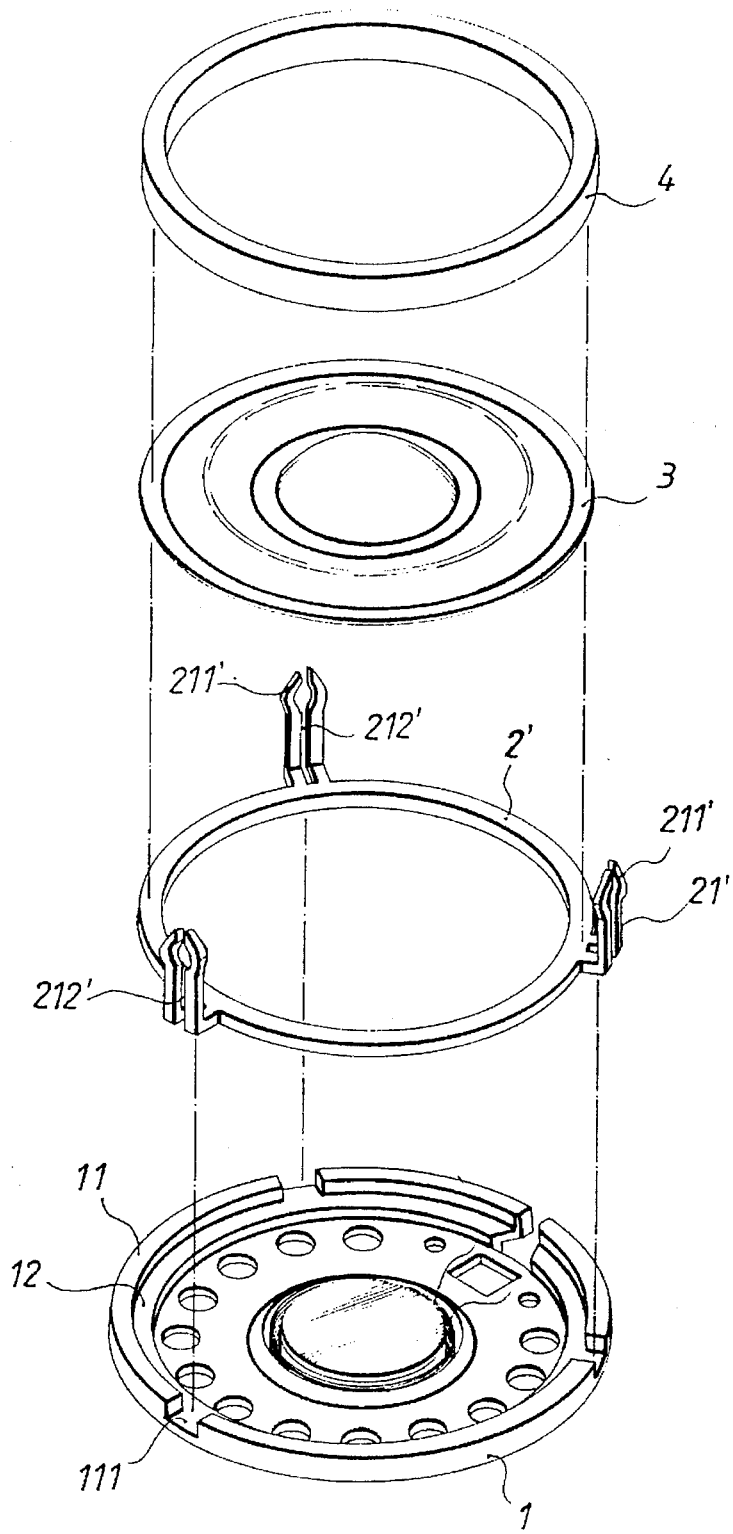
FIG. 2 is an exploded perspective view of another embodiment of the present invention.
Figure 4:
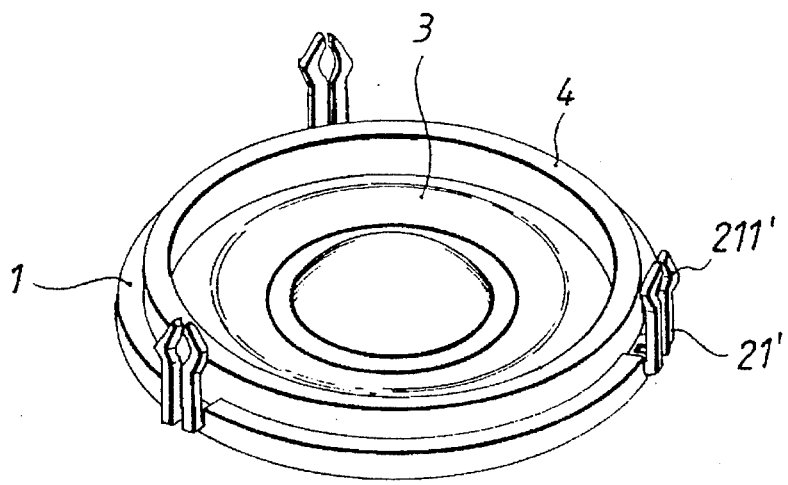
FIG. 4 is a perspective view of the embodiment of FIG. 2.

In addition, as shown in FIG. 2 and FIG. 4, a loudspeaker facing the front of the printed circuit board can be clamped by another example of the present invention. Loudspeaker shell body 1, vibrating membrane 3 and fix ring 4 of the loudspeaker are the same as in the aforementioned embodiment. However, in this embodiment copper ring 2' has L-shaped clips 21' extending upward along with the circumference of the loudspeaker shell body 1. The tips of the vertical ends of the clips 21' still form cone-shaped clippers 211' and the arrow-shaped surfaces of the clips 21' is divided vertically by vertical grooves 212'. Each clip 21' is an elastic clipper. Therefore, the loudspeaker can be clamped into the hole on the front of the printed circuit board 5, as shown in FIG. 6.

Figure 7:
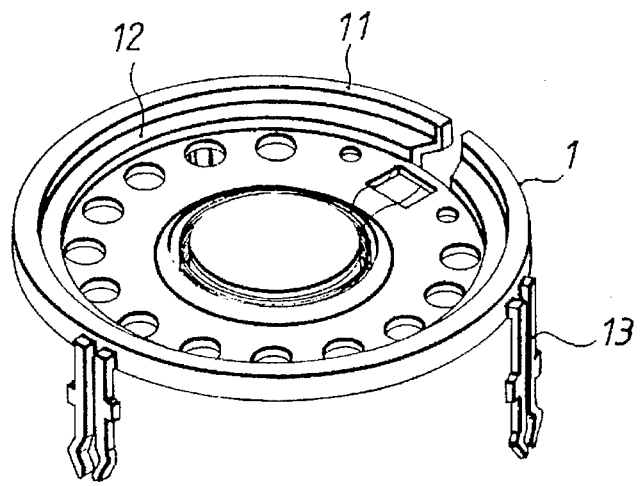
FIG. 7 is a perspective view of the clip of FIG. 3 constructed with one metal stamping around the circumference wall of the loudspeaker shell body in accordance with the present invention.
Figure 8:
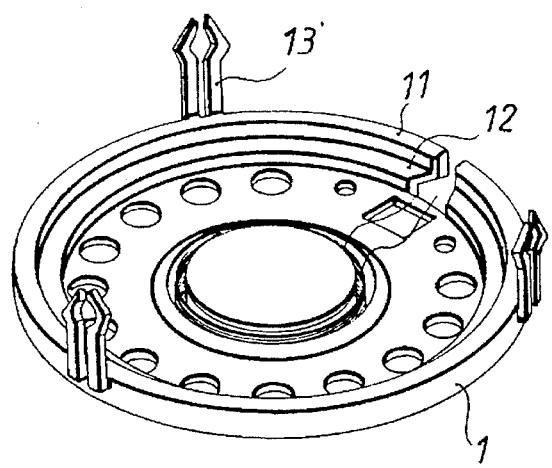
FIG. 8 is a perspective view three-dimensional diagram of the clip of FIG. 4 constructed with one metal stamping around the circumference wall of the loudspeaker shell body in accordance with the present invention.

According to the present invention, the clips 21(21') on the copper ring 2(2') can be constructed around the circumference of the loudspeaker shell body 1 with one metal stamping, as shown in FIG. 7 and FIG. 8. The metal stamping clip 13(131) mounts precisely onto the holes of the printed circuit board 5.

We claim:

1. A miniature loudspeaker clip structure comprising:

a loudspeaker shell body having a circumferential stepped wall with a large step wall and a small step wall, the large step wall having a plurality of concave sections;

a circular copper ring located on the small step wall, the copper ring having a plurality of L-shaped elastic clips, each clip having a horizontal portion passing through a corresponding concave section of the large step wall, and a vertical portion extending from the circumference of the loudspeaker shell, a tip of said each vertical portion forming a cone-shaped clipper wherein an arrow-shaped surface of said each clip is divided vertically by a vertical-groove, and a flange located on a side wall of said each clip;

a vibrating membrane located on the copper ring; and, a circular fix ring attached to the loudspeaker shell body to hold the copper ring and the vibrating membrane thereon wherein the clips of the copper ring, clamp a loudspeaker onto holes of a printed circuit board.

2. The miniature loudspeaker clip structure as claimed in claim 1, wherein the vertical portions of the clips extend from the loudspeaker shell body on the same side as the vibrating membrane and the fix ring.

3. The miniature loudspeaker clip structure as claimed in claim 1 wherein the vertical portions of the clips extend from the loudspeaker shell body on an opposite side from the vibrating membrane and the fix ring.

* * * * *